United States Patent [19]
Yang

[11] Patent Number: 6,023,087
[45] Date of Patent: Feb. 8, 2000

[54] THIN FILM TRANSISTOR HAVING AN INSULATING MEMBRANE LAYER ON A PORTION OF ITS ACTIVE LAYER

[75] Inventor: Hae-Chang Yang, Cheongju, Rep. of Korea

[73] Assignee: LG Semicon Co., Ltd., Choongcheongbuk-Do, Rep. of Korea

[21] Appl. No.: 09/027,899

[22] Filed: Feb. 23, 1998

[30] Foreign Application Priority Data

Jun. 3, 1997 [KR] Rep. of Korea ............... 97-22812

[51] Int. Cl.[7] .................................................. H01L 29/52
[52] U.S. Cl. .................... 257/347; 257/348; 257/349; 257/350; 257/351; 257/352; 257/353; 257/354; 257/59
[58] Field of Search ................ 257/59, 347–354, 257/411

[56] References Cited

PUBLICATIONS

Tanaka, et al., "Characteristics of Offset–Structure Polycrystalline–Silicon Thin–Film Transistors," Ron Device Letters, vol. 9 No. 1. (Jan. 1988) pp. 58–60.

*Primary Examiner*—Fetsum Abraham
*Attorney, Agent, or Firm*—Birch, Stewart, Kolasch & Birch, LLP

[57] ABSTRACT

A thin film transistor and its fabrication method are disclosed wherein the thin film transistor includes a semiconductor substrate, an active layer formed on an upper surface of the semiconductor substrate, a membrane layer formed on a portion of the active layer and defining an offset region in the active layer, a gate insulation layer formed on portions of the membrane layer and the active layer, a gate electrode formed on a portion of the gate insulation layer, and a source region and a drain region formed in the active layer.

13 Claims, 5 Drawing Sheets

THIN FILM TRANSISTOR HAVING AN INSULATING MEMBRANE LAYER ON A PORTION OF ITS ACTIVE LAYER

BACKGROUND OF THE INVENTION

1. Field of the Invention

The present invention relates to a thin film transistor ("TFT"), and more particularly to an improved thin film transistor and a fabrication method thereof for increasing an on/off current ratio of the TFT.

2. Description of the Conventional Art

FIG. 1 shows a cross-sectional view of a conventional top gate type polycrystalline-silicon TFT wherein a gate is formed on an upper portion of a silicon layer. Referring to FIG. 1, the fabrication method of the conventional top gate type polycrystalline-silicon TFT will now be described.

First, on a semiconductor substrate 11 there is formed a first oxide film 12 serving as an insulation layer. A polysilicon layer 13 is formed on the first oxide film 12 using a chemical vapor deposition ("CVD") method. On the polysilicon layer 13 there is formed a second oxide film 14 serving as another insulation layer. Using a mask (not shown), the second oxide film 14 is selectively etched so as to expose portions of the polysilicon layer 13, which will become the upper surface of source/drain regions. A gate electrode 15 is formed on a portion of the second oxide film 14. Impurities of boron or phosphorous are ion-implanted into the exposed surface of the polysilicon layer 13 so as to form the source and drain regions 16, 17. On the source and drain regions 16, 17, there are respectively formed source and drain electrodes 18, 19, which are electrically connected to a corresponding one of the source and drain regions 16, 17. This completes the fabrication method of the conventional TFT.

In the conventional TFT as shown in FIG. 1, when a voltage higher than the voltage of the source electrode 18 is applied to the drain electrode 19 and a voltage higher than the threshold voltage is applied to the gate electrode 15, electrons flow from the source region 16 to the drain region 17 through a channel region 20 and a driving current also flows accordingly.

In the conventional TFT, however, when a voltage is applied to the gate electrode 15 to form a channel, the carrier movability is decreased due to a potential barrier formed at grain boundaries in an interior of the polysilicon layer 13. Therefore, the driving current significantly decreases due to the potential barrier during a turn-on operation of the TFT and further, owing to such a disadvantage, there occurs an irregular current leakage which may decrease the on/off ratio of the drain current.

By providing an offset region and decreasing the irregular leakage current, the on/off current ratio of the TFT may be increased as disclosed in IEEE Electron Device Letters, Vol. 9, No. 1, January 1988, entitled "Characteristics of Offset Structure Polycrystalline Silicon". A description related to such a TFT will be given below with reference to FIG. 2.

As shown in FIG. 2, on a semiconductor substrate 21 there is formed a polysilicon layer 22 using an LPCVD (Lower Pressure Chemical Vapor Deposition). A low density of phosphorous ions are implanted into defined offset regions 23a, 23b. Then a heat treatment is performed on the substrate 21 at a temperature of 900° C. so as to activate the implanted impurities and define source and drain regions 24a, 24b. On the polysilicon layer 22, a gate insulation layer 25 formed by depositing a material such as SiN thereon. The insulation layer 25 is patterned to define a plurality of contact holes 25' through the gate insulation layer 25. Then an aluminum layer is formed on the gate insulation layer 25 including the contact holes 25'. The aluminum layer is selectively etched so as to form a gate electrode 26, a source electrode 27 and a drain electrode 28. The offset length Ls of the offset regions 23a, 23b varies from 3 μm to 7 μm.

Meanwhile, in accordance with the offset regions 23a, 23b, the TFT in FIG. 2 has a higher on/off current ratio than the conventional TFT in FIG. 1. However, the TFT in FIG. 2 suffers from the disadvantage of decreased current during the "on" period of the TFT because the offset region 23a is in direct contact with and adjacent to the source region 24a.

To correct this problem, a transistor without any offset regions located adjacent the source region has been proposed. However, such a transistor suffers from a problem in that a mask must be provided to define the source/drain regions and the offset regions. Since self-alignment is not achieved in such a transistor, its fabrication process becomes complicated. Further, the offset regions are formed by an ion-implantation and therefore an accurate length of the offset regions may be difficult to obtain.

SUMMARY OF THE INVENTION

Accordingly, it is an object of the present invention to provide a thin film transistor and a fabrication method thereof for increasing an on/off current ratio of the TFT and for accurately defining the offset regions and source/drain regions with self-alignment.

To achieve the above and other objects, there is provided a thin film transistor according to the embodiments of the present invention which includes a semiconductor substrate, an active layer formed on an upper surface of the semiconductor substrate, a membrane layer formed on a portion of the active layer and defining an offset region in the active layer, a gate insulation layer formed on portions of the membrane layer and the active layer, a gate electrode formed on a portion of the gate insulation layer, and a source region and a drain region formed in the active layer.

Furthermore, to achieve the above and other objects, there is provided a thin film transistor fabrication method according to the embodiments of the present invention which includes the steps of forming an active layer on a semiconductor substrate, forming a membrane layer on a portion of the active layer so as to define an offset region in the active layer, forming a gate insulation layer on portions of the membrane layer and the active layer, forming a gate electrode on a portion of the gate insulation layer, and forming a source region and a drain region in the active layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more clearly understood with reference to the accompanying drawings given only by way of illustrations and thus not limited to the present invention, and wherein.

DETAILED DESCRIPTION OF THE PREFERRED EMBODIMENTS

With reference to the accompanying drawings, the thin film transistor and the method of fabricating the same according to the present invention will now be described.

Figure 1:
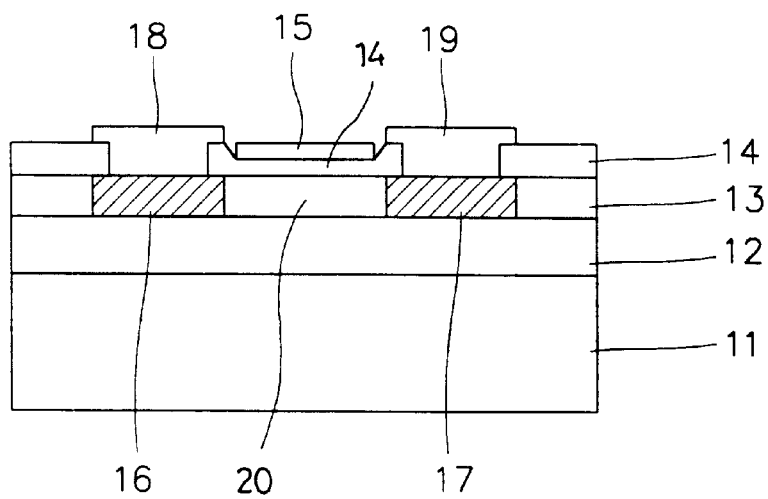
FIG. 1 is a cross-sectional view of a conventional top gate type polycrystalline silicon thin film transistor.
Figure 2:
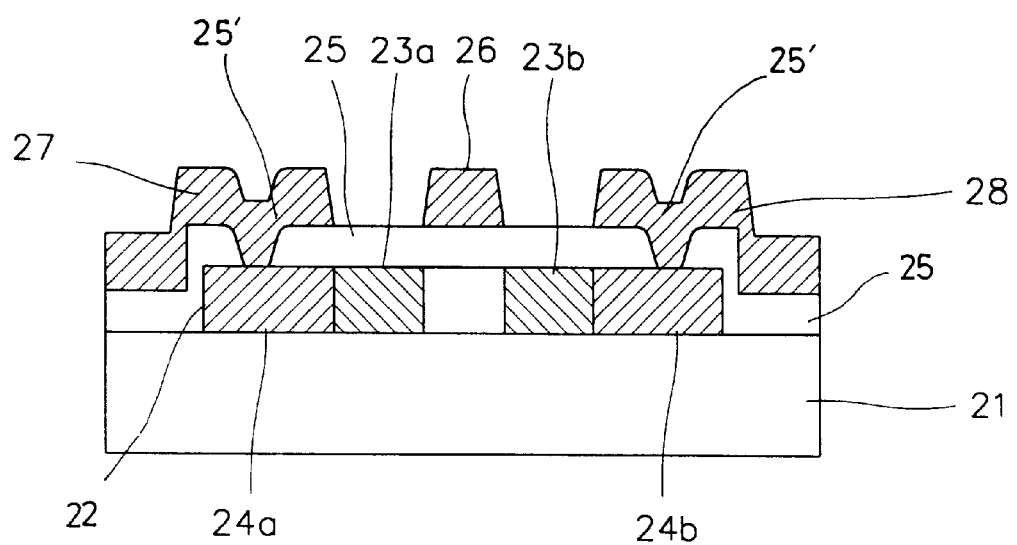
FIG. 2 is a cross-sectional view of another conventional thin film transistor including offset regions.
Figure 3:
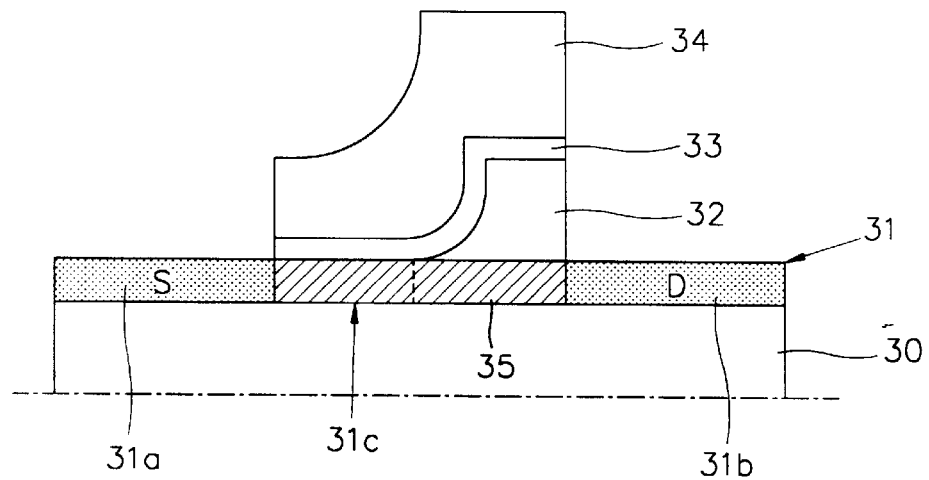
FIG. 3 is a cross-sectional view of a thin film transistor according to the embodiments of the present invention.

FIG. 3 shows a cross-sectional view of a thin film transistor according to the embodiments of the present invention.

As shown in FIG. 3, there is provided an insulation substrate or a semiconductor substrate 30 with an insulation material disposed thereon. On the semiconductor substrate 30, an active layer 31 such as a polysilicon layer is formed. The active layer 31 includes a source region 31a, a drain region 31b, and a channel region 31c including an offset region 35. The source region 31a and the drain region 31b are respectively formed on the sides of the channel region 31c.

On the upper surface of the channel region 31c of the active layer 31, a membrane layer (offset insulation layer) 32 composed of an oxide layer or a nitride layer is formed. The membrane layer 32 has a particular shape and an increasing thickness toward the drain region 31b. The increasing thickness of the membrane layer 32 remains constant once it reaches a predetermined thickness.

On the upper surfaces of the channel region 31c and the membrane layer 32, a gate insulation layer 33 is formed with an oxide or a nitride. On the surface of the gate insulation layer 33, a gate electrode 34 is formed with a doped polysilicon layer. Within the channel region 31c and below the membrane layer 32, an offset region 35 is correspondingly defined in the active layer 31. This offset region 35 radically decreases the off- current and thus increases the on/off current ratio of the drain region 31b, even though the threshold voltage may be slightly increased by the membrane layer 32. Further, the membrane layer 32 is not limited to the shape shown in FIG. 3, but may be formed to have, e.g., flat inclined portions (instead of a curved inclined portion) or a constant slope of increasing thickness towards the drain region 31b. Moreover, thin film transistors allow self-alignment of the offset region 35, the membrane layer 32, the gate insulation layer 33 and the gate electrode 34 with respect to the source and drain regions 31a and 31b.

With reference to FIGS. 4A through 4I, a fabrication method of a thin film transistor according to the embodiments of the present invention will now be described.

Figure 4A:
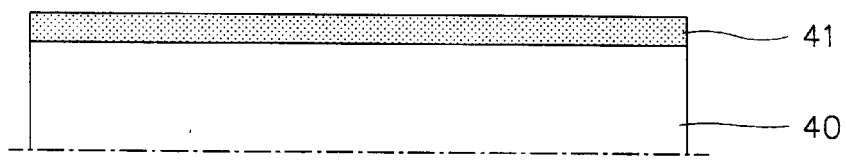
FIGS. 4A through 4I are sequential views of a fabrication process of a thin film transistor according to the embodiments of the present invention.
Figure 4B:
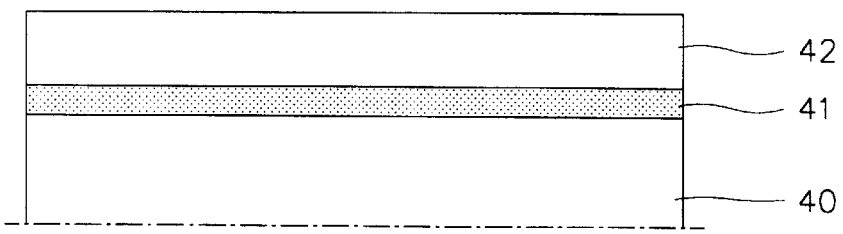

As shown in FIG. 4A, on a semiconductor substrate 40 formed with an insulation material, there is formed an active layer 41 made with, e.g., a polysilicon layer. As shown in FIG. 4B, on the active layer 41 a first insulation layer 42 made with an oxide material or a nitride material is formed.

Figure 4C:
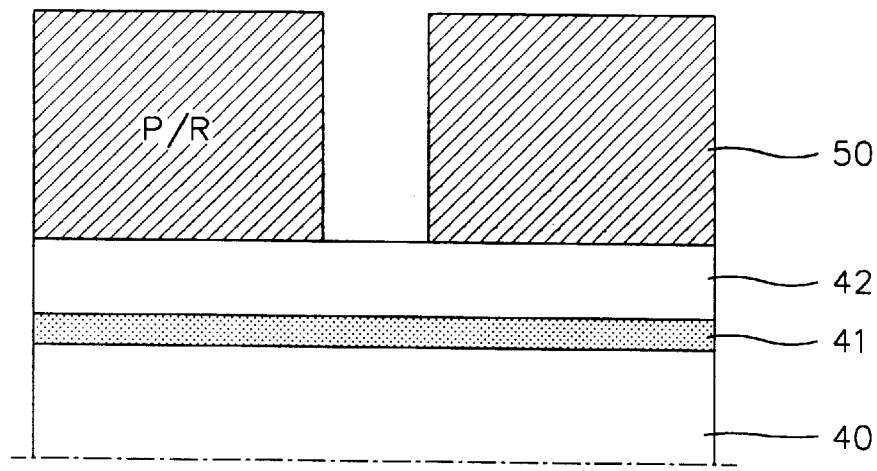
Figure 4D:
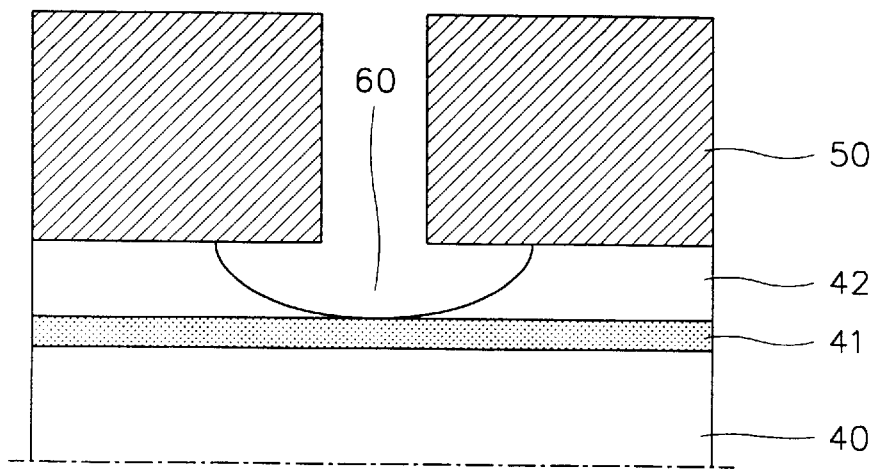

As shown in FIG. 4C, on the first insulation layer 42 there is formed a first photoresist pattern 50 using a known photolithographic method. As shown in FIG. 4D, using the first photoresist pattern 50 as a mask, the first insulation layer 42 is etched to expose a surface of the active layer 41 and to define a recessed portion 60. The first insulation layer 42 is etched using an amorphous wet etching method so that the recessed portion 60 has a non-crystalline wet etching profile.

Figure 4E:
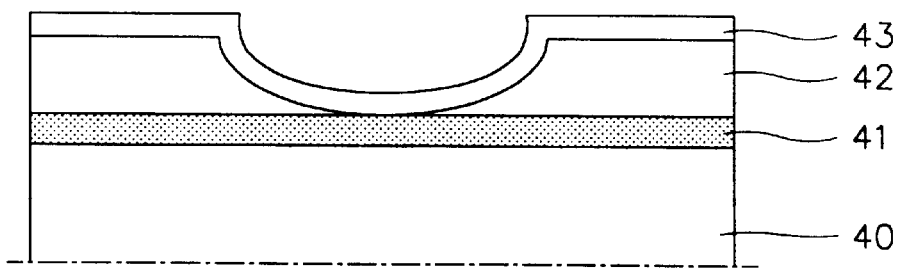
Figure 4F:
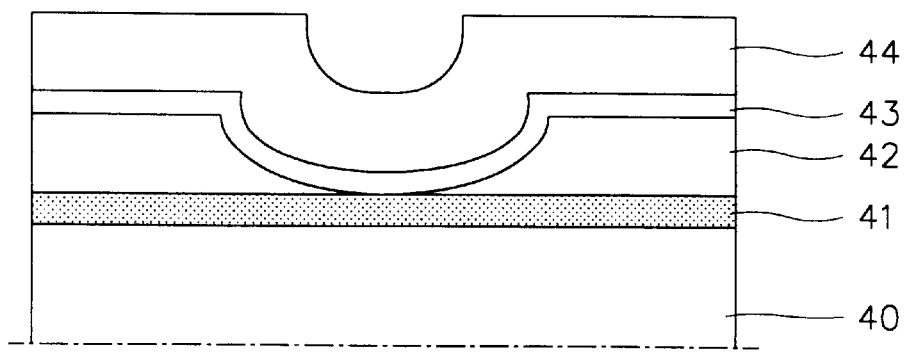

As shown in FIG. 4E, after removing the first photoresist pattern 50, a second insulation layer 43 is formed by depositing an oxide material or a nitride material on the first insulation layer 42 including the recessed portion 60. As further shown in FIG. 4F, there is formed a doped polysilicon layer 44 on the upper surface of the second insulation layer 43.

Figure 4G:
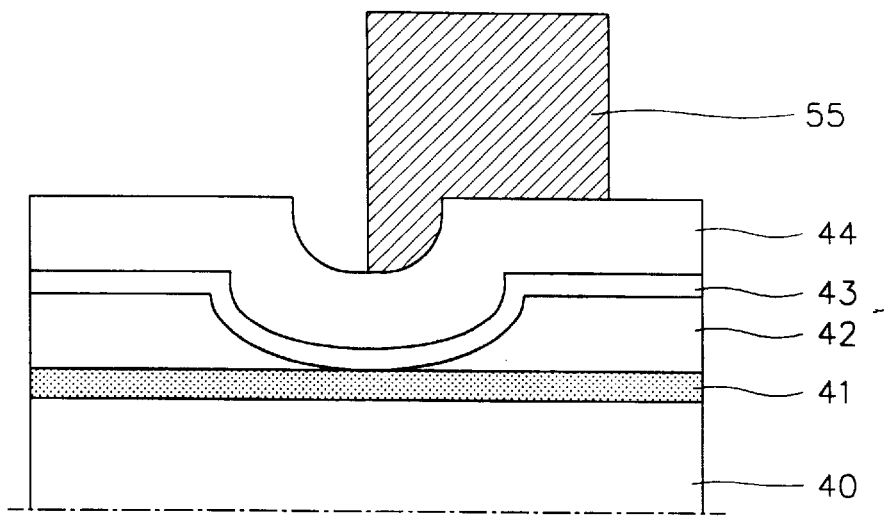

As shown in FIG. 4G, on a portion of the doped polysilicon layer 44, a second photoresist pattern 55 is formed using a known photolithographic method. The second photoresist pattern 55 extends from a middle portion of the recessed portion 60 to a predetermined distance, wherein the predetermined distance is identical to the width of a gate electrode 44a to be formed subsequently. That is, the second photoresist pattern 55 is provided to define a gate electrode 44a, a gate insulation layer 43a and a membrane layer 42a which are formed in the subsequent steps.

Figure 4H:
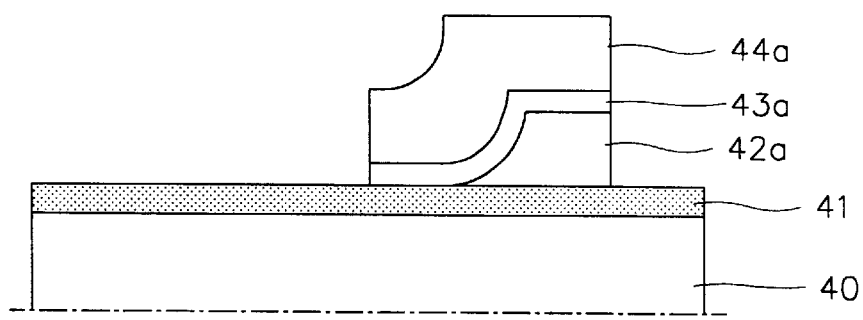

As shown in FIG. 4H, using the second photoresist pattern 55 as a mask, the doped polysilicon layer 44, the second insulation layer 43 and the first insulation layer 42 are selectively etched until certain surfaces of the active layer 41 are exposed. This forms the gate electrode 44a made of a doped polysilicon, the gate insulation layer 43a made of an oxide material or a nitride material, and the membrane layer 42a made of an oxide material. Therefore, when the gate electrode 44a is formed, the gate insulation layer 43a and membrane layer 42a are concurrently formed by self-alignment. Thereafter, the second photoresist pattern 55 is completely removed.

Figure 4I:
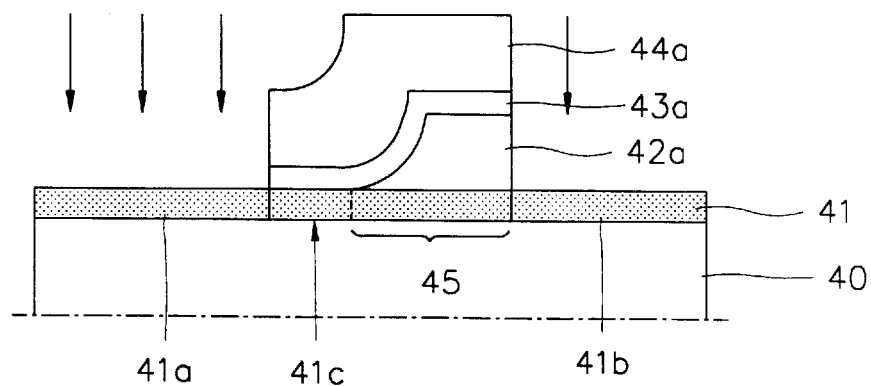

As shown in FIG. 4I, boron or phosphorous ions are implanted into the active layer 41 using the gate electrode 44a as a mask, thereby forming the source and drain regions 41a and 41b in the active layer 41 on the sides of the gate electrode 44a. This completes the fabrication process of the TFT according to the present invention.

The channel region 41c is defined between the source region 41a and the drain region 41b. The offset region 45 is formed as part of the channel region 41c and is defined by the lower surface of the membrane layer (offset insulation layer) 42a. Although different references numerals have been used, the thin film transistor structure of FIG. 4I is identical to that shown in FIG. 3.

As described above, the thin film transistor as fabricated according to the present invention is provided with a membrane layer formed with an oxide material or a nitride material for defining an offset region. Using the membrane layer to define the offset region, instead of a mask as in the conventional TFT fabrication method, the source/drain regions are formed by self-alignment, thereby reducing and simplifying the process steps and accurately defining the offset region length.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thin film transistor comprising:

a semiconductor substrate;

an active layer formed on an upper surface of the semiconductor substrate;

a membrane layer formed on a portion of the active layer and defining an offset region in the active layer;

a gate insulation layer formed on portions of the membrane layer and the active layer;

a gate electrode formed on a portion of the gate insulation layer; and a source region and a drain region formed in the active layer.

2. The transistor of claim 1, wherein a lower surface of the membrane layer defines the boundaries of the offset region in the active layer.

3. The transistor of claim 1, wherein the semiconductor substrate is formed with an insulation material.

4. The transistor of claim 1, wherein the active layer is formed with polysilicon.

5. The transistor of claim 1, wherein the membrane layer is formed with one of an oxide material and a nitride material.

6. The transistor of claim 1, wherein the gate insulation layer is formed with an oxide material.

7. The transistor of claim 1, wherein the gate electrode is formed with doped polysilicon.

8. The transistor of claim 1, wherein the membrane layer has a thickness which increases towards the drain region and then remains constant to one end of the membrane layer.

9. The transistor of claim 1, wherein an edge of the membrane layer is aligned with an edge of the drain region.

10. The transistor of claim 1, wherein edges of the membrane layer, the gate insulation layer and the gate electrode are aligned with an edge of the drain region.

11. The transistor of claim 1, wherein the membrane layer has a portion whose thickness increases towards the drain region.

12. The transistor of claim 1, wherein edges of the gate insulation layer and the gate electrode are aligned with an edge of the source region.

13. The transistor of claim 1, further comprising:

a channel region formed in the active layer between the source and drain regions, and including the offset region.

* * * * *